(12) United States Patent
Confalonieri et al.

(10) Patent No.: US 6,480,436 B2
(45) Date of Patent: Nov. 12, 2002

(54) NON-VOLATILE MEMORY WITH A CHARGE PUMP WITH REGULATED VOLTAGE

(75) Inventors: Emanuele Confalonieri, Milan (IT); Lorenzo Bedarida, Vimercate (IT); Mauro Sali, S. Angelo Lodigiano (IT); Simone Bartoli, Cambiago (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/909,467

(22) Filed: Jul. 19, 2001

(65) Prior Publication Data

US 2002/0018390 A1 Feb. 14, 2002

(30) Foreign Application Priority Data

Jul. 26, 2000 (EP) .................................... 00830529

(51) Int. Cl.[7] .................................................. G11C 7/00
(52) U.S. Cl. ................................. 365/226; 365/189.09
(58) Field of Search ........................ 365/226, 189.09, 365/189.11, 227, 210

(56) References Cited

U.S. PATENT DOCUMENTS

| | | | |
|---|---|---|---|
| 4,954,990 A | 9/1990 | Vider | 365/185 |
| 5,313,429 A | 5/1994 | Chevallier et al. | 365/226 |
| 5,519,656 A * | 5/1996 | Maccrrone et al. | 365/189.09 |
| 5,946,258 A | 8/1999 | Everett et al. | 365/226 |
| 6,101,118 A * | 8/2000 | Mulatti et al. | 365/149 |

FOREIGN PATENT DOCUMENTS

| | | | |
|---|---|---|---|
| EP | 0576774 | 1/1994 | G11C/16/06 |
| WO | 95/07536 | 3/1995 | G11C/16/06 |

* cited by examiner

*Primary Examiner*—Richard Elms
*Assistant Examiner*—Anh Phung
(74) *Attorney, Agent, or Firm*—Lisa K. Jorgenson; Allen, Dyer, Doppelt, Milbrath & Gilchrist, P.A.

(57) ABSTRACT

A semiconductor memory includes a plurality of memory cells connected to one another to form a matrix of memory cells. A charge pump is connected to the matrix of memory cells. A plurality of controllable connection elements are provided, with each controllable connection element connected between an output terminal of the charge pump and a respective column line. Connected to the output of the charge pump is the series connection of a first element equivalent to a controllable connection element, and a second element equivalent to a memory cell in a predetermined biasing condition. A voltage regulator is connected between the second equivalent element and the input terminal of the charge pump for regulating the output voltage therefrom based upon a voltage present between terminals of the second equivalent element.

31 Claims, 3 Drawing Sheets

NON-VOLATILE MEMORY WITH A CHARGE PUMP WITH REGULATED VOLTAGE

FIELD OF THE INVENTION

The present invention relates to integrated circuits, and more particularly, to a non-volatile memory with a regulated charge pump.

BACKGROUND OF THE INVENTION

Semiconductor memories use peripheral circuit structures known as charge pumps which can generate voltages higher than that of the supply voltage of the integrated device in which the memory is formed. These voltages serve for writing, reading and erasure operations on the memory. A regulation system is generally associated with the charge pump for keeping its output voltage constant for a given range of currents absorbed by the load. Known regulation systems detect the output voltage of the charge pump, compare it with a constant reference voltage, and apply to the input of the charge pump a compensation signal based upon the comparison to keep the output at a predetermined voltage level.

The output of the charge pump is generally connected to the component that is to receive the voltage. This connection is provided by a connection element having electrical conduction characteristics which are dependent on temperature, design selections, and on the parameters associated with the manufacturing process. The voltage applied to the component is therefore not constant, as would be desirable, but depends on the temperature and on the above mentioned parameters. A method of avoiding this problem would be to pick up the voltage to be regulated directly downstream of the connection element but this is not possible in some cases, for example, in the case of an electrically erasable and programmable non-volatile memory, such as a flash EEPROM memory.

A typical EEPROM memory is formed on a substrate of semiconductor material as a matrix of memory cells each including a body region with p-type conductivity in which two (source and drain) regions with n-type conductivity are formed. These two regions are separated by a channel region. A floating gate electrode is disposed above the channel region, insulated therefrom by a thin layer of dielectric material. A control gate electrode extends above the floating gate electrode, insulated therefrom by another layer of dielectric material.

The cells of the matrix have their source regions connected together to a common terminal which, during programming and reading, is generally connected to the negative terminal (ground) of the voltage supply of the integrated circuit of which the memory is included therein. The drain regions of the cells of each column of the matrix are connected to one another by common connection lines, known as bit or column lines. The control gate electrodes of the cells of each row are connected to one another by common connection lines known as word or row lines.

Each cell of the matrix can be selected by a row decoder and a column decoder. Once selected, the cell can be biased by the application of suitable potentials to its terminals, and its state can be determined by a sense amplifier arranged in series with the respective bit line.

To write or program a cell of the memory, the bit line and the word line which identify it are brought to predetermined potentials higher than the common source potential, for example 5V and 9V, respectively, to cause hot electrons to pass through the thin dielectric layer from the substrate to the floating gate electrode. The electrons which accumulate in the floating gate electrode bring about an increase (e.g., 2–4V) in the threshold voltage of the cell.

To erase a cell, a positive potential (e.g., 5V) is applied to the common source terminal, a negative potential (e.g., −8V) is applied to the word line (the control gate), and the bit line (the drain) is left floating. In these conditions, a strong electric field is developed between the floating gate electrode and the source region so that the negative charge formed by the accumulated electrons is extracted from the floating gate electrode by the tunnel effect. In a flash EEPROM memory, erasure takes place simultaneously for all of the cells of the matrix or for the cells of a selected section of the matrix.

To read a cell, the common source terminal is connected to ground, the bit line (drain) is brought to a positive potential, the word line (control gate) is brought to a higher positive potential, and the drain current is measured by the sense amplifier. An erased cell (logic level 1) conducts a relatively high current (e.g., 50 μA) and a programmed cell (logic level 0) conducts a considerably lower current.

As mentioned above, a cell is selected by connecting its drain and control gate electrodes to biasing circuits outside the matrix by bit and word decoders. The decoders comprise, basically, electronic switches controlled by the system logic. The electronic switches are normally formed by MOS transistors having small dimensions. Since the resistance of these transistors when they are conducting is not negligible when the drain currents are high, as they are during the programming of a cell, the voltage drop in them is considerable. This would not be a problem if the voltage drop were constant and precisely predictable. However, this depends on the operating temperature and on the manufacturing parameters.

When the drain terminal of a cell is connected to a charge pump to program the cell, its potential therefore varies in an uncontrolled manner, even though the output voltage of the charge pump is stabilized. In particular, the voltage applied to the cell decreases as the temperature increases. Moreover, since the hot-electron emission mechanism becomes less efficient at high temperatures, the programming of a cell becomes problematic at high temperatures.

SUMMARY OF THE INVENTION

In view of the foregoing background, an object of the present invention is to provide a memory with a charge pump which does not have the problems as discussed above.

Another object of the present invention is to form a memory with a charge pump such that the voltage of a memory cell is in a predetermined biasing condition, for example, in the programming condition, and is independent of variations in temperature and in the manufacturing and design parameters of the memory.

These and other objects, advantages and features of the present invention are provided by a semiconductor memory comprising a plurality of electrically programmable, non-volatile memory cells connected to one another by row lines and by column lines to form a matrix of memory cells. A charge pump may be connected to the matrix of memory cells, and includes an input terminal, an output terminal, and a common terminal.

A regulator may be connected to the input of the charge pump for regulating an output voltage therefrom, and a plurality of controllable connection elements, with each controllable connection element connected between the output terminal of the charge pump and a respective column line. Control means selectively activates the plurality of controllable connection elements.

More particularly, the memory further includes a first element equivalent to a controllable connection element, and a second element equivalent to a memory cell in a predetermined biasing condition. The first equivalent element and the second equivalent element are connected in series with one another between the output terminal and the common terminal of the charge pump. The regulator may be connected between the second equivalent element and the input terminal of the charge pump for regulating the output voltage therefrom based upon a voltage present between terminals of the second equivalent element.

BRIEF DESCRIPTION OF THE DRAWINGS

The invention will be understood better from the following detailed description of an embodiment thereof given by way of non-limiting examples with reference to the appended drawings, in which.

DETAILED DESCRIPTION OF THE PREFERRED EMBODIMENTS

Figure 1:
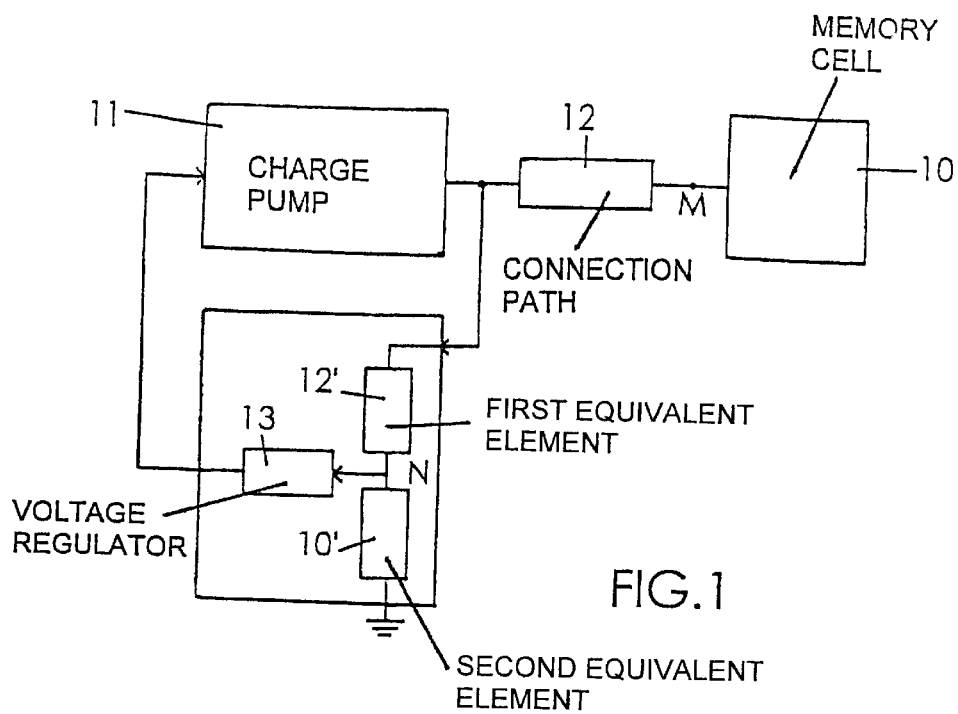
FIG. 1 is a block diagram of the basic structure of the memory according to the present invention.

In the diagram of FIG. 1, a memory cell 10 is connected to a charge pump 11 by a connection path 12. Two circuit elements are connected in series between the output of the charge pump 11 and a common terminal indicated by the ground symbol. A first element 12' is electrically equivalent to the connection path 12, and a second element 10' is electrically equivalent to the memory cell 10 when biased in a predetermined biasing condition, such as the programming condition, for example.

A voltage regulator 13 is connected between the connection node N between the two elements 12' and 10', and the input of the charge pump 11. Since, by construction, the elements 12' and 10' are equivalent to the connection path 12 and to the cell 10, respectively, the potential of the node N is equal to that of the node M between the path 12 and the cell 10 so that the output voltage of the charge pump 11 is regulated dependent upon the voltage actually present in the cell. With variations in the temperature and in the characteristics of the manufacturing process, the potential differences which appear in the connection path 12 and in the element 12' equivalent thereto are equal and do not affect the regulation.

Figure 2:
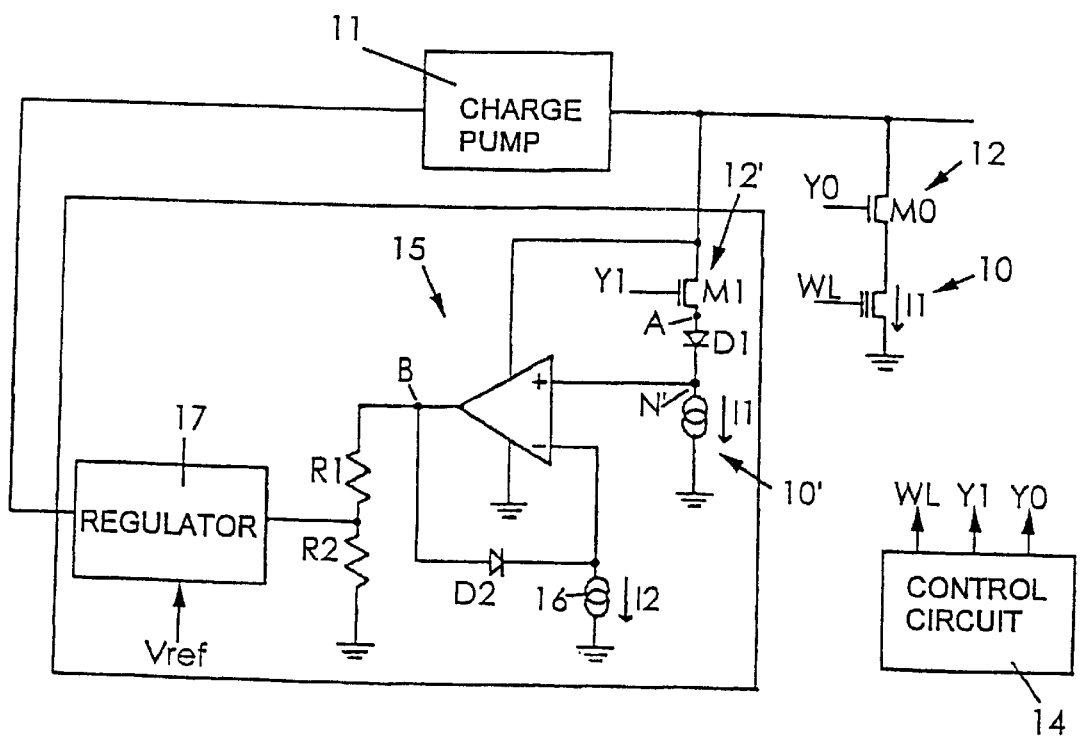
FIG. 2 is a more detailed block diagram of the memory according to the present invention.

In the diagram of FIG. 2, the connection path 12 is represented by a transistor M0, known as the selection transistor, which forms part of a column decoder (not shown) that contains similar selection transistors for each column line. The gate electrode of the transistor M0 is connected to a control circuit 14 of the memory which, among other functions, selectively activates the connections between column lines and the charge pump 11 by suitable signals (Y0 in the drawing) at the gate electrodes of the selection transistors.

A transistor indicated M1, which is identical to the selection transistor M0, is connected with its drain-source path in series with a diode D1 and with a current generator 10'. The latter is formed to absorb a current I1 of equal intensity to the current absorbed by a cell in a predetermined biasing condition, such as in the programming condition, for example.

Since, in practice, not all of the cells of a memory matrix are identical for reasons connected with the variability of the manufacturing parameters, the current absorbed during programming is a quantity which varies between a minimum value and a maximum value in accordance with a statistical distribution. The current I1 of the generator 10' is selected to be equal to the maximum value which the programming current can adopt.

The diode D1, biased in the direction of direct conduction, forms a voltage-level shifter the function of which will be explained below. The connecting node N' between the diode D1 and the generator 10' is connected to the input terminal of a unity gain amplifier 15 formed by an operational amplifier having its inverting input connected to its output by a diode D2 and to ground by a generator 16. The output of the amplifier is connected to a voltage divider R1 and R2, the intermediate terminal of which is connected to the input of a voltage regulator 17. The regulator 17 has an input terminal connected to a circuit, not shown, which generates a constant reference voltage Vref substantially independent of the temperature. The output of the regulator 17 is connected to the regulation input terminal of the charge pump 11.

The unity gain amplifier 15 has the function of decoupling the structure with the equivalent elements M1 and 10' from the regulator 17. In this embodiment of the invention, the amplifier 15 is supplied by the output voltage of the charge pump 11. The diode D1 has the function of shifting the level of the input voltage of the amplifier to take account of the fact that the supply voltage of the amplifier is very close to the input voltage. The input range is modified by the level shift for permitting correct transfer of the signal. The diode D2 has the function of restoring the original voltage level at the output of the amplifier which is provided via feedback.

The output voltage of the amplifier 15 is equal to the voltage to be regulated, that is, to that of the connection node A between the transistor M1 and the diode D1. To reduce consumption, the diode D2 is preferably formed in an area equal to a fraction k of the area of the diode D1, and the generator 16 is formed to generate a current I2 which is the same fraction k of the current I1 of the generator 10': I1/I2=area(D1)/area(D2)=k.

Figure 3:
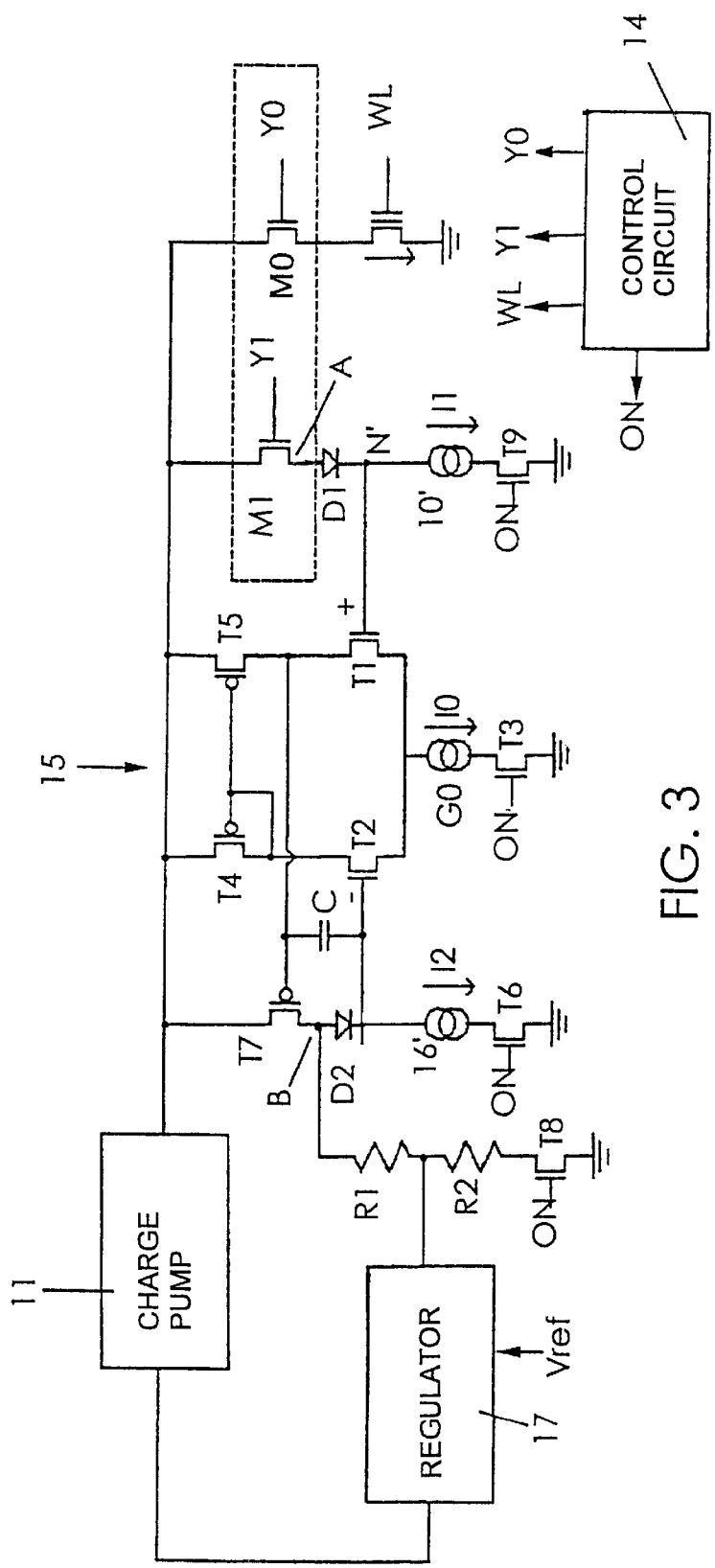
FIGS. 3 and 4 are block diagrams illustrating different embodiments of the circuits within the memory according to the present invention.

FIG. 3 shows the operational amplifier of FIG. 2 which, in practice, is formed as a differential stage. Two n-channel MOS transistors T1 and T2 have their source terminals connected together to a terminal of a current generator G0, which has another terminal connected to the ground terminal by an electronic switch formed by a transistor T3. The drain terminals of the transistors T1 and T2 are connected to the respective drain terminals of two p-channel MOS transistors T4 and T5 in a current mirror configuration, and with their source terminals connected together to the output of the charge pump 11.

The gate terminals of the transistors T1 and T2 are connected, respectively, as a non-inverting input terminal to the node N' and as an inverting input terminal, via the current generator 16' and another electronic switch T6, to ground. The output of the differential amplifier is picked up at the drain terminal of the transistor T1 by a p-channel MOS transistor T7 in the common source configuration. The inverting input of the differential amplifier is also connected to the drain terminal of the transistor T7 by the diode D2. The latter is biased for conduction by the generator 16' and forms the negative feedback connection, also shown in FIG. 2. The voltage divider R1, R2 is connected on one end to the drain terminal of the transistor T7, and on the other end to ground via an electronic switch formed by a transistor T8.

The closed-loop gain of the amplifier is set to be equal to 1, so that the output voltage at the node B (the drain of the transistor T7) is equal to the input voltage at the node N'. The generator 10' is also connected to ground by an electronic switch formed by a transistor T9.

To stabilize the circuit, a compensation capacitor C is connected between the output terminal and the inverting input of the differential amplifier. The capacitor C may advantageously be formed as a MOS capacitor since the minimal biasing voltage required by this type of capacitor for its operation is ensured by the diode D2. The gate terminals of the transistors T3, T6, T8 and T9 are connected to the control logic circuit 14 to receive a closure signal, indicated by ON, when the regulation circuit is to be activated.

Figure 4:
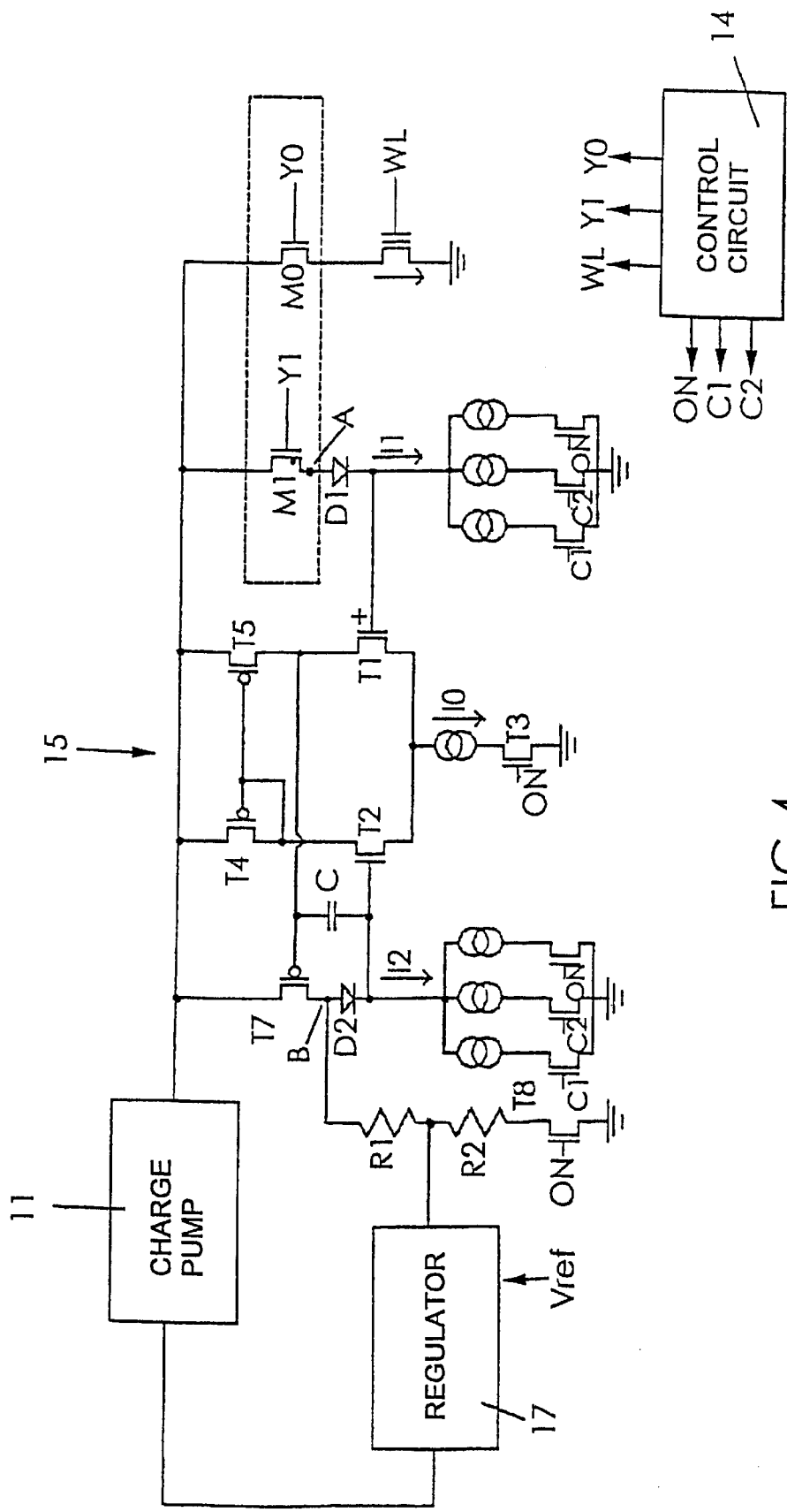

As stated above, the generator 10' absorbs a current of an intensity equal to the maximum current absorbed by one cell of the memory during programming. When this quantity cannot be defined precisely at the design stage, according to the embodiment of the invention of FIG. 4, the element equivalent to the cell which, in the embodiment of FIG. 3 was formed by a single branch with the generator 10' and the switch T9 in series, is an adjustable current generator formed by several similar branches, that is, three branches in parallel with one another in the embodiment shown.

Similarly, instead of the branch with the generator 16' and the switch T6, three branches are provided in parallel. The switches are kept closed or open, thus keeping the corresponding generators active or inactive, dependent on the current which actually flows through a cell biased for programming. To implement this function after the production of the memory, a measurement is made to determine the maximum current absorbed by a cell during programming, and one or more generator branches in parallel are activated by suitable signals (ON, C1, C2) generated by a configuration device in the control logic circuit 14. The element equivalent to the cell absorbs a current as close as possible to that resulting from the measurement.

As is clear from the foregoing, the effect of the invention is to ensure that the output voltage of the charge pump is regulated as if the output of the pump were connected directly to the cell being programmed, so that the regulation is always precise and is not affected by temperature variations or by manufacturing parameters.

Although only one embodiment of the invention has been described and illustrated, clearly many variations are possible within the scope of the same inventive concept. For example, the regulated voltage for the charge pump could be intended for biasing memory cells in reading conditions or in erasure conditions instead of for biasing the cells for programming.

That which is claimed is:

1. A semiconductor memory comprising
   a plurality of electrically programmable, non-volatile memory cells connected to one another by row lines and by column lines to form a matrix of memory cells;
   a charge pump connected to said matrix of memory cells;
   a plurality of controllable connection elements, with each controllable connection element being connected between an output of said charge pump and a respective column line;
   control means for selectively activating said plurality of controllable connection elements;
   a first element equivalent to a controllable connection element and being connected to the output of said charge pump;
   a second element equivalent to a memory cell in a biased condition and being connected in series with said first element and a common voltage reference; and
   a regulator connected between said second element and an input of said charge pump for regulating an output voltage therefrom based upon a voltage between terminals of said second element.

2. A semiconductor memory according to claim 1, wherein said second element comprises at least one adjustable current generator.

3. A semiconductor memory according to claim 2, wherein said control means adjusts a current of said at least one adjustable current generator to a predetermined value.

4. A semiconductor memory according to claim 3, wherein the predetermined value is equal to a current which flows through said memory cell in the biased condition.

5. A semiconductor memory according to claim 2, wherein said at least one adjustable current generator comprises a plurality of adjustable current generators connected together in parallel.

6. A semiconductor memory according to claim 5, further comprising a respective switch connected in series with each adjustable current generator.

7. A semiconductor memory according to claim 1, wherein the biased condition of the memory cell corresponds to at least one of a programming operation, a reading operation, and an erasure condition.

8. A semiconductor memory according to claim 1, wherein said regulator comprises an amplifier with unity current gain.

9. A semiconductor memory according to claim 8, wherein said amplifier is supplied by the output voltage of said charge pump.

10. A semiconductor memory according to claim 9, further comprising a first voltage-level shifter connected in series with said first element; and wherein said amplifier comprises a negative feedback path comprising a second voltage-level shifter.

11. A semiconductor memory according to claim 10, wherein each of said first and second voltage-level shifters comprises a diode biased in a direction of direct conduction.

12. A memory comprising
    a plurality of memory cells connected to one another by row lines and by column lines to form a matrix of memory cells;
    a charge pump connected to said matrix of memory cells;
    a plurality of controllable connection elements, with each controllable connection element being connected between an output of said charge pump and a respective column line;
    a first element equivalent to a controllable connection element and being connected to the output of said charge pump;
    a second element equivalent to a memory cell in a biased condition and being connected in series with said first element and a common voltage reference; and
    a regulator connected between said second element and an input of said charge pump for regulating an output voltage therefrom based upon a voltage between terminals of said second element.

13. A semiconductor memory according to claim 12, further comprising a control circuit for selectively activating said plurality of controllable connection elements.

14. A semiconductor memory according to claim 12, wherein said second element comprises at least one adjustable current generator.

15. A semiconductor memory according to claim 14, wherein said control circuit adjusts a current of said at least one adjustable current generator to a predetermined value.

16. A semiconductor memory according to claim 15, wherein the predetermined value is equal to a current which flows through said memory cell in the biased condition.

17. A semiconductor memory according to claim 14, wherein said at least one adjustable current generator comprises a plurality of adjustable current generators connected together in parallel.

18. A semiconductor memory according to claim 17, further comprising a respective switch connected in series with each adjustable current generator.

19. A semiconductor memory according to claim 12, wherein the biased condition of the memory cell corresponds to at least one of a programming operation, a reading operation, and an erasure condition.

20. A semiconductor memory according to claim 12, wherein said regulator comprises an amplifier with unity current gain.

21. A semiconductor memory according to claim 20, wherein said amplifier is supplied by the output voltage of said charge pump.

22. A semiconductor memory according to claim 21, further comprising a first voltage-level shifter connected in series with said first element; and wherein said amplifier comprises a negative feedback path comprising a second voltage-level shifter.

23. A semiconductor memory according to claim 22, wherein each of said first and second voltage-level shifters comprises a diode biased in a direction of direct conduction.

24. A method for regulating a charge pump connected to a memory comprising a plurality of memory cells connected to one another by row lines and by column lines to form a matrix of memory cells, the method comprising:

selectively activating a plurality of controllable connection elements, with each controllable connection element being connected between an output of the charge pump and a respective column line;

selectively activating a first element equivalent to a controllable connection element and being connected to the output of the charge pump;

controlling at least one second element for being equivalent to a memory cell in a biased condition, the second element being connected in series with the first element and a common voltage reference; and regulating an output voltage from the charge pump based upon a voltage between terminals of the second element.

25. A method according to claim 24, wherein the regulating is performed by a regulator connected between the second element and an input of the charge pump.

26. A method according to claim 24, wherein controlling the at least one second element comprises adjusting at least one current generator.

27. A method according to claim 26, wherein the at least one current generator is adjusted to a predetermined value.

28. A method according to claim 27, wherein the predetermined value is equal to a current which flows through the memory cell in the biased condition.

29. A method according to claim 26, wherein the at least one adjustable current generator comprises a plurality of adjustable current generators connected together in parallel.

30. A method according to claim 29, wherein each adjustable current generator has connected in series therewith a respective switch.

31. A method according to claim 24, wherein the biased condition of the memory cell corresponds to at least one of a programming operation, a reading operation, and an erasure condition.

* * * * *